US012640338B2

(12) United States Patent
    Eyring

(10) Patent No.: US 12,640,338 B2
(45) Date of Patent: May 26, 2026

(54) SCREENING EDGE PLACEMENT UNIFORMITY WAFER STOCHASTICS

(71) Applicant: KLA Corporation, Milpitas, CA (US)

(72) Inventor: Stefan Eyring, Weilburg (DE)

(73) Assignee: KLA Corporation, Milpitas, CA (US)

( * ) Notice: Subject to any disclaimer, the term of this patent is extended or adjusted under 35 U.S.C. 154(b) by 507 days.

(21) Appl. No.: 17/967,854

(22) Filed: Oct. 17, 2022

(65) Prior Publication Data

US 2023/0326710 A1      Oct. 12, 2023

Related U.S. Application Data

(60) Provisional application No. 63/328,017, filed on Apr. 6, 2022.

(51) Int. Cl.
    *H01J 37/22*      (2006.01)
    *H01J 37/244*      (2006.01)
    *H01J 37/28*      (2006.01)

(52) U.S. Cl.
    CPC .......... *H01J 37/222* (2013.01); *H01J 37/244* (2013.01); *H01J 37/28* (2013.01); *H01J 2237/2814* (2013.01); *H01J 2237/2817* (2013.01)

(58) Field of Classification Search
    CPC ........ H01J 37/222; H01J 37/244; H01J 37/28; H01J 2237/2814; H01J 2237/2817; G03F 7/706837; G03F 7/706839; H01L 22/12; G01N 23/2251; G01N 2223/102; G01N 2223/104; G01N 2223/106; G01N 2223/305; G01N 2223/401; G01N 2223/418; G01N 2223/6116; G01N 2223/646; G01B 15/02; G01B 15/04
    See application file for complete search history.

(56) References Cited

U.S. PATENT DOCUMENTS

| | | | |
|---|---|---|---|
| 7,402,257 | B1 | 7/2008 | Sonderman et al. |
| 7,434,199 | B2 | 10/2008 | Cobb et al. |
| 7,587,704 | B2 | 9/2009 | Ye et al. |

(Continued)

FOREIGN PATENT DOCUMENTS

| | | |
|---|---|---|
| CN | 110501870 A | 11/2019 |
| CN | 112991268 B | 6/2021 |

(Continued)

OTHER PUBLICATIONS

Fractilia, LLC, "New Stochastics Solution from Fractilia Enables Semiconductor EUV Fabs to Control Multi-Billion-Dollar Idustry Yield Problem," Mar. 21, 2022.

(Continued)

*Primary Examiner* — Hung V Nguyen
(74) *Attorney, Agent, or Firm* — Hodgson Russ LLP

(57) ABSTRACT

A simulated tool signal is determined from design data and tool properties of the tool making the measurements. A design-assisted composite signal is determined from measurements. An edge placement uniformity signal is then determined by comparing the simulated tool signal and the design-assisted composite signal. A shape and/or an area of the edge placement uniformity signal can be analyzed. The edge placement uniformity signal enables screening of structures with respect to wafer stochastics without the need to fully characterize all individual structures.

18 Claims, 7 Drawing Sheets

(56) References Cited

U.S. PATENT DOCUMENTS

| | | | |
|---|---|---|---|
| 7,623,978 B2 * | 11/2009 | Lally | H01L 21/76808 |
| | | | 702/183 |
| 9,404,743 B2 | 8/2016 | Chiu et al. | |
| 10,185,800 B2 | 1/2019 | Eyring et al. | |
| 10,197,908 B2 | 2/2019 | Sriraman et al. | |
| 10,474,042 B2 | 11/2019 | Biafore et al. | |
| 10,818,001 B2 * | 10/2020 | Leung | H01L 22/20 |
| 10,901,325 B2 | 1/2021 | Gurevich et al. | |
| 11,126,090 B2 | 9/2021 | Hansen | |
| 12,085,385 B2 | 9/2024 | Eyring et al. | |
| 2004/0221255 A1 | 11/2004 | Pierrat et al. | |
| 2009/0248341 A1 | 10/2009 | Tian et al. | |
| 2017/0016715 A1 | 1/2017 | Heidrich et al. | |
| 2017/0082927 A1 | 3/2017 | Hsu et al. | |
| 2018/0173839 A1 | 6/2018 | Fang et al. | |
| 2020/0082523 A1 | 3/2020 | Leung et al. | |
| 2020/0190667 A1 | 6/2020 | Shaikh et al. | |
| 2021/0043483 A1 | 2/2021 | Zhong et al. | |
| 2021/0149312 A1 | 5/2021 | Tel et al. | |
| 2021/0382394 A1 | 12/2021 | Levinson et al. | |
| 2022/0042936 A1 * | 2/2022 | Okai | G06N 3/045 |

FOREIGN PATENT DOCUMENTS

| | | | |
|---|---|---|---|
| KR | 20190054933 A | 5/2019 | |
| TW | 201603158 A | 1/2016 | |
| TW | 202212766 A | 4/2022 | |
| WO | 2020233950 A1 | 11/2020 | |
| WO | 2021016407 A1 | 1/2021 | |
| WO | 2022012888 A1 | 1/2022 | |

OTHER PUBLICATIONS

Eppler, "Controlling Uniformity at the Edge," Semiconductor Engineering, Oct. 19, 2017.

Bhattacharyya, "Tough Road Ahead for Device Overlay and Edge Placement Error," Proc of SPIE, 2019, 1095902-1 to 1095902-8.

Villarrubia et al., "3D Monto Carlo Modeling of the SEM: Are There Applications to Photomask Metrology," Proc. of SPIE, 2014, 923602-1 to 923602-12.

WIPO, International Search Report for International Application No. PCT/US2023/017003, Jul. 7, 2023.

WIPO, Written Opinion of the International Searching Authority for International Application No. PCT/US2023/017003, Jul. 7, 2023.

Mack, C.A., Systematic errors in the measurement of power spectral density, Journal of Micro/Nanolithography, MEMS, and MOEMS, Jul. 2013, vol. 12, No. 3, 033016, 11 pages.

EPO, Supplementary European Search Report issued for European Application No. 23785190, Nov. 18, 2025.

* cited by examiner

200

Determining design-assisted composite signal
201

Determining simulated tool signal
202

Determining edge placement uniformity signal
203

SCREENING EDGE PLACEMENT UNIFORMITY WAFER STOCHASTICS

CROSS-REFERENCE TO RELATED APPLICATIONS

This application claims priority to the provisional patent application filed Apr. 6, 2022 and assigned U.S. App. No. 63/328,017, the disclosure of which is hereby incorporated by reference.

FIELD OF THE DISCLOSURE

This disclosure relates to semiconductor metrology.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it maximizes the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etching, deposition, and ion implantation. An arrangement of multiple semiconductor devices fabricated on a single semiconductor wafer may be separated into individual semiconductor devices.

Metrology processes are used at various steps during semiconductor manufacturing to monitor and control the process. Metrology processes are different from inspection processes in that, unlike inspection processes in which defects are detected on wafers, metrology processes are used to measure one or more characteristics of the wafers that cannot be determined using existing inspection tools. Metrology processes can be used to measure one or more characteristics of wafers such that the performance of a process can be determined from the one or more characteristics. For example, metrology processes can measure a dimension (e.g., line width, thickness, etc.) of features formed on the wafers during the process. In addition, if the one or more characteristics of the wafers are unacceptable (e.g., out of a predetermined range for the characteristic(s)), the measurements of the one or more characteristics of the wafers may be used to alter one or more parameters of the process such that additional wafers manufactured by the process have acceptable characteristic(s).

Metrology tools are designed to make many different types of measurements for semiconductor manufacturing such as measuring characteristics of one or more targets. These characteristics can include, for example, critical dimensions (CDs), overlay, sidewall angles, film thicknesses, line edge roughness (LER), line width roughness (LWR), pattern placement errors, or process-related parameters (e.g., focus and/or dose). The targets can include certain regions of interest that are periodic in nature, such as, for example, gratings in a memory die. The metrology targets may possess various spatial characteristics and are typically constructed of one or more cells which may include features in one or more layers printed in one or more lithographically distinct exposures. The targets or the cells may possess various symmetries such as two-fold or four-fold rotation symmetry and/or reflection symmetry. Different cells or combinations of cells may belong to distinct layers or exposure steps. The individual cells may comprise either isolated non-periodic features or, alternately, they may be constructed from one, two, or three dimensional periodic structures or combinations of non-periodic and periodic structures. The periodic structures may be non-segmented or they may be constructed from finely segmented features that can be at or close to the minimum design rule of the lithographic process used to print them. The metrology targets may also be collocated or in close proximity with dummification structures in the same layer or in a layer above, below, or in between the layers of the metrology structures. Targets can include multiple layers (or films) whose thicknesses can be measured by the metrology tool. Targets can include target designs placed (or already existing) on the semiconductor wafer for use (e.g., with alignment and/or overlay registration operations). Certain targets can be located at various places on the semiconductor wafer. For example, targets can be located within the scribe lines (e.g., between dies) and/or located in the die itself. In certain embodiments, multiple targets are measured at the same time or at differing times by the same or multiple metrology tools. The data from such measurements may be combined. Data from the metrology tool is used in the semiconductor manufacturing process to feed-forward, feed-backward, and/or feed-sideways corrections to the process (e.g., lithography, etch) and, therefore, might yield a complete process control solution.

Photolithography can have defects driven by the quantized nature of light and materials. For example, light is quantized into photons, and the chemical reactants in photoresist are discrete molecules. These are often called shot noise defects or stochastic defects. These stochastic defects can be prevalent for extreme ultraviolet (EUV) lithography, but can appear at exposure wavelengths used in other lithographic processes such as ArF immersion. "Stochastic" means that the average behavior may be within desired specification (e.g., photoresist width, tip-to-tip measurement for line-ends, or photoresist thickness) while simultaneously exhibiting fluctuations that cause the pattern to fail (e.g., bridging or breaking for a line/space pattern) with a non-zero probability. Given that a wafer includes billions of transistors, even small failure probabilities can lead to substantial yield loss.

Stochastic defects may present multiple challenges in a fabrication environment. Typically, defects may be assumed to be deterministic such that a known defect will consistently be present when fabricated according to a known production recipe including a pattern of elements to be fabricated on a sample and exposure parameters. For example, process window qualification (PWQ) typically identifies process-limiting defects that always occur when exposure conditions fall outside of a process window. In an instance, a process window may define limits on the defocus associated with the position of the sample along the optical axis of the lithography tool (e.g., the focal position of the sample) or the dose of energy from the illumination source incident on the sample during exposure.

Previously, features on a semiconductor wafer were measured individually. For example, a scanning electron microscope (SEM) or critical dimension SEM (CDSEM) was used for high-resolution imaging of individual patterns on a wafer. Each pattern was evaluated separately and fully characterized, which led to low sampling or low throughput. Low sampling limits information about wafer stochastics.

Improved systems and techniques are needed.

BRIEF SUMMARY OF THE DISCLOSURE

A method is provided in a first embodiment. The method includes determining, using a processor, a design-assisted composite signal from a plurality of features on a wafer using measurements of the wafer from a wafer metrology tool and a design of the wafer. Using the processor, a simulated tool signal for the design of the wafer that accounts for noise sources and imaging properties of the wafer metrology tool is determined. Using the processor, an edge placement uniformity signal that is a difference between the design-assisted composite signal and the simulated tool signal is determined.

The wafer metrology tool can be a scanning electron microscope.

The measurements of the wafer can be generated during overlay measurements of the wafer.

The method can further include analyzing a shape and/or an area of the edge placement uniformity signal. The shape and the area are caused by at least stochastics. Distribution of edge placement errors can be determined based on the shape. The method also can further include inspecting the wafer at locations with the edge placement errors.

The measurements can be of a plurality of lines of devices on the wafer. Each of the plurality of lines can have one of the edge placement uniformity signals.

The method can further include comparing, using the processor, the edge placement uniformity signal against a specification for the wafer.

The design-assisted composite signal can be an average of the measurements.

The feature can be an edge of a structure on the wafer or a center of a structure on the wafer.

A non-transitory computer readable medium storing a program can be configured to instruct the processor to execute the method of the first embodiment.

A system is provided in a second embodiment. The system includes a particle beam source that generates an electron beam; a stage configured to hold a wafer in a path of the particle beam; a detector that receives particles from the wafer; and a processor in electronic communication with the detector. The processor is configured to: determine a design-assisted composite signal from a plurality of features on the wafer using measurements of the wafer and a design of the wafer; determine a simulated tool signal for the design of the wafer that accounts for noise sources and imaging properties of the wafer metrology tool; and determine an edge placement uniformity signal that is a difference between the design-assisted composite signal and the simulated tool signal.

The particle beam can be an electron beam, a photon beam, an ion beam, or a neutral particle beam. In an instance, the system is a scanning electron microscope.

The processor can be further configured to analyze a shape and/or an area of the edge placement uniformity signal. The shape and the area are caused by at least stochastics. The processor can be further configured to determine distribution of edge placement errors based on the shape. The processor also can be configured to send instructions to inspect the wafer at locations with the edge placement errors using the particle beam.

The processor can be further configured to compare the edge placement uniformity signal against a specification for the wafer.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Figure 1:
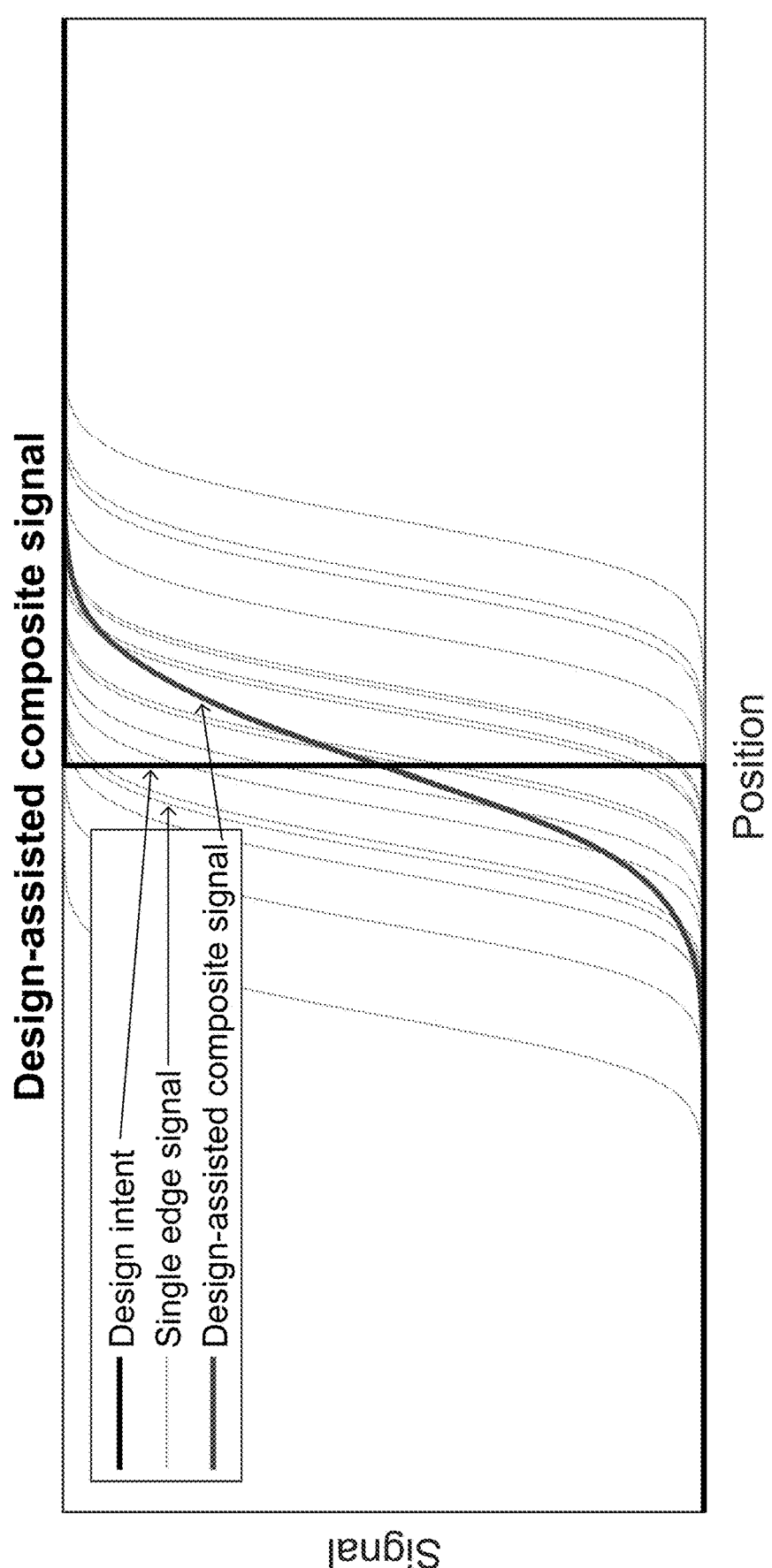
FIG. 1 is an exemplary diagram showing combination of multiple edge signals to generate a design-assisted composite signal.

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein compare a design-assisted composite signal to a simulated tool signal. The difference of both signals can be used to characterize wafer stochastics of the measured features, referred to as edge placement uniformity (EPU). This can be used for fast screening of wafer stochastics while performing other measurements such as overlay metrology. Depending on the EPU, various actions for process control can be taken.

Scanning metrology tools are particularly suitable for generating high-resolution measurements of a sample (e.g., a wafer). For example, a resolution of a scanning metrology tool may be based on a spot size of an illumination spot, which may be tightly controlled. However, scanning metrology may suffer from various limitations such as low measurement throughput (e.g., long measurement times) and/or damage to the sample during a measurement induced by the illumination beam.

Mitigating various sources of stochastic noise associated with a fabrication process such as LER or LWR when using some types of metrology measurements can be beneficial. Common examples include, but are not limited to, dimensional measurements (e.g., CD measurements), pattern placement (e.g., registration) measurements, or overlay measurements (e.g., relative positions of features fabricated using different exposures). Techniques for mitigating such stochastic noise typically involve generating a high-resolution image of a fabricated structure on a sample and then averaging measurements at different locations on the structure. However, such image-based techniques may similarly suffer from low measurement throughput and/or sample damage during a measurement. As a result, users typically either generate measurements of a low number of structures to provide reasonable throughput or generate measurements of a desired number of structures with a low throughput. In all cases, users must further take steps to limit the energy deposition on the sample during a measurement (e.g., an exposure dose associated with an incident energy per area on the sample), which may negatively impact the measurement sensitivity, or sacrifice some samples during measurement.

Embodiments disclosed herein use detection signals associated with multiple instances of a fabricated structure that are combined into a single data set, which is referred to herein as design-assisted composite data. For example, a metrology system may scan an illumination beam in a scan pattern that contacts common features on multiple instances of a fabricated structure (e.g., a common location on the multiple instances). As an illustration, common features of a line structure may include, but are not limited to, a left edge, a central portion, and a right edge. Consequently, the scan pattern may cross the same location or locations on the various instances of the structure such that repeated measurements of the structure are generated. Design data associated with the intended locations and/or orientations of the instances of the structure across the sample may then be used to correlate and combine detection data of the common features from the multiple instances of the structure. The design-assisted composite data may then include any statistical combination of the data from the various instances of the structure such as, but not limited to, average values, median values, or the like. Various metrology measurements of the structure may then be generated using this design-assisted composite data.

Using design-assisted composite data provides flexibility to select the scan pattern, which may overcome many of the limitations of typical scanning-based metrology techniques such as image-based averaging. For example, metrology using design-assisted composite data does not require the formation of an image of any particular instances of the structure of interest. Rather, a low-noise signal is generated by combining data from measurements of multiple instances of the structure. In this way, metrology using design-assisted composite data may be analogized to phase-locked loop measurements that utilize signal periodicity to provide sensitive measurements. This analogy is merely illustrative and is not limiting. For example, metrology using design-assisted composite data does not require periodic signals of any type, but rather utilizes design information to correlate data associated with common features of a structure to provide sensitive, low-noise measurements.

Metrology based on design-assisted composite data as disclosed herein can provide multiple benefits. For example, design-assisted composite data from many instances of a structure of interest across a sample may generally provide substantially more sample points for averaging (or other statistical combination) than is possible with traditional imaging techniques, which results in a high signal-to-noise ratio and more sensitive measurements. For example, traditional image-based averaging may be limited by a length of a structure of interest over an averaging direction and/or an imaging field of view (FOV), whereas design-assisted composite data may be formed from any number of instances of the structure. By way of another example, the scan pattern may generally include any number of traces of any design since an image of any particular structure is not needed. In another example, the scan pattern may be selected to limit or avoid damage to the sample during measurement. Expanding a FOV can reduce the exposure dose for a given measurement by spreading the deposited energy over a larger area. In some embodiments, a scan pattern includes a sparse set of traces over a relatively large FOV, which may beneficially contact many instances of a structure of interest and also limit or avoid damage to the sample. For instance, the sparse set of traces may be spaced substantially further apart than would be required for a typical high-resolution image of any particular structure.

Metrology with design-assisted composite data as disclosed herein may be implemented by any type of scanning metrology system known in the art including particle-based scanning systems (e.g., electron, ion, or neutral particle) or optical scanning systems. In this way, the systems and methods disclosed herein may be implemented using particle beams, light beams, or any combination thereof.

Figure 6:
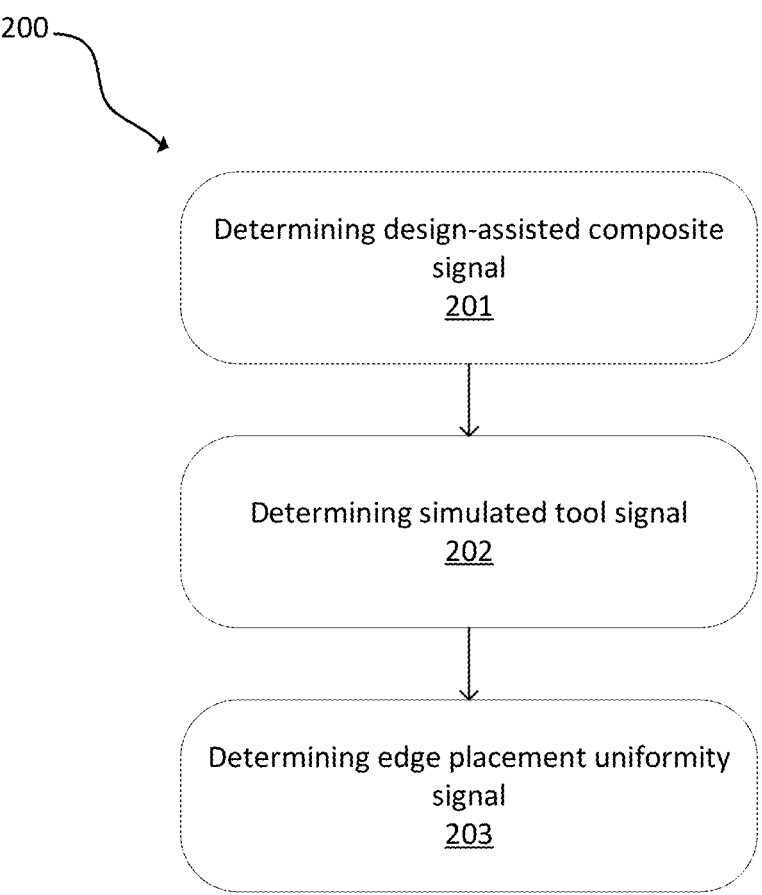
FIG. 6 is a flowchart of an embodiment of a method in accordance with the present disclosure.

FIG. 6 illustrated a method 200. Some or all of the steps of the method 200 can be performed using a processor.

At 201, a design-assisted composite signal is determined from multiple edges of features on the wafer. This can use measurements of a wafer from a wafer metrology tool (e.g., a SEM) and a design of the wafer. The measurements can be of a repeating feature across a surface of a wafer like an edge of a structure on the wafer or a center of a structure on the wafer. For example, the measurements can be of lines of devices on the wafer. Each of the lines has one of the edge placement signals.

Figure 2:
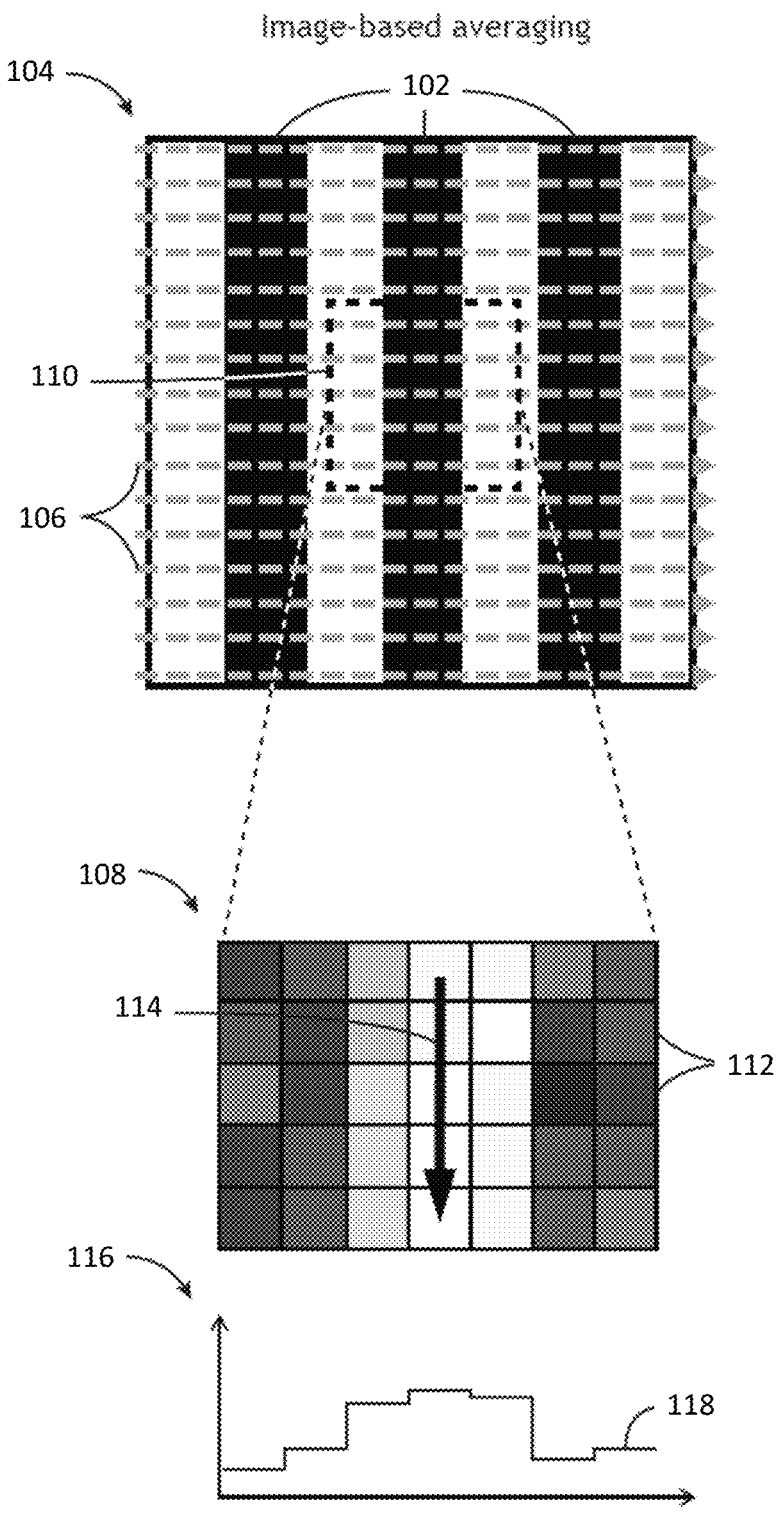
FIG. 2 is an example of image-based averaging.
Figure 3:
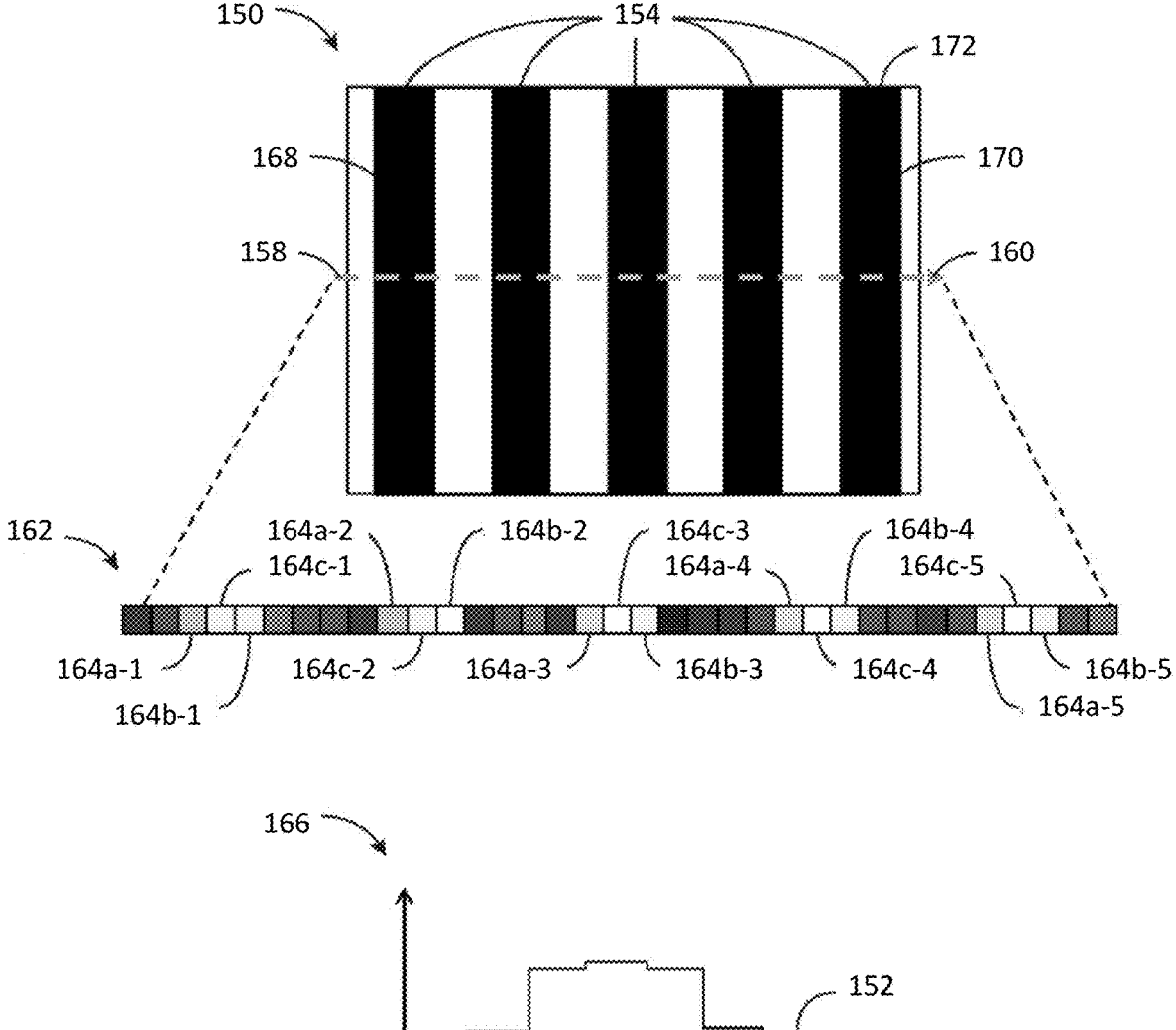
FIG. 3 is an example of generation of design-assisted composite data for repeated instances of a line structure.

The design-assisted composite signal can be generated using embodiments of U.S. application Ser. No. 17/524,152 titled "Design-Assisted Large Field of View Metrology," which is incorporated herein in its entirety. FIGS. 1-3 show examples of generating a design-assisted composite signal. The measurements can be combined to form the design-assisted composite signal.

In some metrology applications, stochastic variations may be considered as noise that reduces the signal-to-noise ratio, the measurement sensitivity, and/or the measurement accuracy. Common but non-limiting examples include measurements of the shape, orientation, or position of fabricated structures such as CD measurements, position (e.g., registration) measurements, or overlay measurements.

FIG. 1 shows the design-assisted composite signal, which is an average or other composite of the various single edge signals that are measured. These can be compared to the design intent, which is the desired structure on the wafer. The design intent is the expected measurement for the design. Tool inaccuracies and noise can blur the single edge signals relative to the design intent. The difference between the design intent and the single edge signals also may be caused by the structure being incorrectly positioned on the wafer, such as through LER or other stochastics.

FIG. 2 is a conceptual illustration of an image-based averaging technique for metrology in accordance with an embodiment of the present disclosure. In particular, FIG. 2 illustrates averaging multiple measurements on different locations of a line structure 102. A typical scanning metrology process may include generating a high-resolution image 104 of the sample including at least one instance of a structure of interest (here, three instances of a line structure 102) using a dense array of linear traces 106 across a FOV. In this way, multiple traces 106 generate data associated with a particular line structure 102 at different locations. For example, the inset 108 illustrates a conceptual depiction of detection signals associated with five traces 106 at different locations along the line structure 102 (e.g., five rows of the image 104) with a region of interest 110. In this inset 108, each pixel 112 represents a measurement along a trace 106 and variations of the values of the pixels 112 along between traces 106 corresponds to stochastic noise.

The trace 106 represents a signal generated along the path of the beam. In an imaging case such as FIG. 2, this can be equivalent to a pixel line. The pixel line can be a row or column depending on the scanning method.

In this typical image-based technique, the stochastic noise may be mitigated by averaging data along a direction orthogonal to the traces 106 (here, the vertical direction 114). The inset 116 illustrates a conceptual plot of such image-averaged data 118. The image-averaged data 118 can include the single edge signal of FIG. 1 and/or the design-assisted composite signal of FIG. 1. Image-based averaging averages multiple pixel lines without using the design. Noise can be somewhat reduced. Tool noise reduction is comparable, but wafer stochastics tend to be only on a localized scale and not to the same extent as in the full design-assisted averaging case.

The image-based averaging technique illustrated in FIG. 2 may suffer from various limitations. For example, the number of data points available to average is limited by a number of traces 106 on any particular instance of a structure of interest, which may in turn be limited by the size, shape, or geometry of the structure. While FIG. 2 illustrated line structures filling the FOV of the image 104, the structures of interest may generally have any shape, size, or orientation. As a result, the number of data points available for averaging may be more limited in practice. In another example, the number of traces 106 (and the number of data points available for averaging) may not be increased arbitrarily. Rather, the density of the traces 106 and, thus, the number of data points available for averaging may be limited by the damage threshold of the sample or structures thereon. As an illustration, photomasks (e.g., photoresists) may have relatively low damage thresholds that may limit the effectiveness of image-based averaging techniques. In another example, the generation of such high-resolution images typically are time-consuming, which may limit the size of the FOV and the measurement throughput overall.

The presence of repeated instances of structures of interest can be used to provide sensitive, high-throughput metrology. In particular, data associated with common features (e.g., locations) of multiple instances of a structure of interest may be combined based on design data including the intended locations and/or orientations of the various instances of the structure across the sample. Such data may be referred to as design-assisted composite data. In this way, the number of data points available for combination (e.g., by averaging or any other statistical combination) may be limited only by the number of instances of the structure of interest along a scan pattern. The illustration in FIG. 1 averages the various single edge signals. Furthermore, there is no requirement that an image of any particular structure be generated. A single trace across each instance of a structure may suffice in some applications. As a result, the FOV and the exposure dose may be substantially reduced, which can enable measurements with relatively high intensities without inducing damage and/or can provide a desired measurement throughput.

Design data associated with the intended locations and/or orientations of the instances of the structure across the sample can then be used to correlate and combine detection data of the common features from the multiple instances of the structure. The design-assisted composite data may then include any statistical combination of the data from the various instances of the structure such as, but not limited to, average values, median values, or the like. Various metrology measurements of the structure can then be generated using this design-assisted composite data.

A design of various fabricated instances of a structure on a sample can be used in determining the design-assisted composite data. The sample can include a semiconductor device at any stage of fabrication including repeated instances of various fabricated structures, a photomask (e.g., a photoresist) including repeated instances of photomask structures used in the fabrication process, or any other material including repeated instances of one or more structures of interest.

The design data may include any type of data from any source providing information about the intended design of a structure of interest on the sample including, but not limited to, locations of the structure, a shape of the structure, or an orientation of the structure at each location. For example, the design data may include schematics of the sample used to guide the fabrication of various layers (e.g., graphic design system (GDS) data or the like), metrology measurements of the sample taken at the current or any previous process step, or a combination thereof.

In some embodiments, an illumination spot can be scanned along a scan pattern with respect to the sample (e.g., using the scanning metrology tool or the like), where the scan pattern crosses at least one common feature on the plurality of fabricated instances of the structure on the sample. The scan pattern may include any type or design of traces suitable for intersecting with at least one common feature of the instances of the structure to be measured. For example, the scan pattern may include one or more linear scan traces, which may be, but are not required to be, parallel. In another example, the scan pattern may include one or more curved scan traces.

The detection signals from the scanning metrology tool can be associated with the scan pattern. Thus, detection signals generated by the scanning metrology tool along the scan pattern may be correlated to location on the sample.

Design-assisted composite data for the structure can be determined by combining detection signals from common features of the structure from the fabricated instances of the structure using the design data. For example, the design data may be used to correlate detection signals of common features of the structure across multiple instances of the structure across the sample. The design-assisted composite data may then include any statistical combination of detection signals from the common features of the structure, such as average values. A common feature across multiple instances of a structure may include any feature of the structure, such as an edge or a center position.

To correlate detection signals, the design data can be analyzed to find the design-intent locations of identical/similar patterns (e.g., lines of same width and similar surrounding). Only traces which contain these locations may be used for signal processing. The trace can be optimized before the measurement to maximize the amount of usable signal.

The design-assisted composite data can be generated with a high-resolution image or without generating a conventional high-resolution image of any particular instance of a structure of interest. Rather, the design-assisted composite data can be built up by measurements of common features on many different instances of the structure of interest.

FIG. 3 is an example of the generation of design-assisted composite data 152 for repeated instances of a line structure 154, in accordance with one or more embodiments of the present disclosure. The inset 150 illustrates five instances of the line structure 154 and a portion of a scan pattern 158 (e.g., a linear trace 160) across the various instances of the line structure 154.

The inset 162 is a schematic view of detection signals generated by a scanning metrology tool along the portion of the scan pattern. For example, the detection signals include a series of pixels 164 associated with a sampling rate of the scanning metrology tool. The scanning metrology tool may include any type of scanning metrology tool known in the art utilizing any type of scanned illumination beam such as a particle beam (e.g., an electron beam, an ion beam, a neutral particle beam, or the like) or a light beam of any wavelength.

The inset 166 is an illustrative plot of design-assisted composite data 152 generated using the detection signals and design data associated with the design of the line structures 154. For example, the design-assisted composite data 152 may be generated by using the design data to correlate particular pixels 164 of the detection signals associated with common features of the line structures 154.

As an illustration, pixels 164a-1, 164a-2, . . . 164a-5 may be associated with a left edge 168 of a line structure 154 (e.g., a first common feature), while pixels 164b-1, 164b-2, . . . 164b-5 may be associated with a right edge 170 of a line structure 154 (e.g., a second common feature). Similarly, the pixels 164c-1, 164c-2, . . . 164c-5 may be associated with a central portion 172 of a line structure 154 (e.g., a third common feature). The correlated pixels 164 may then be combined into the design-assisted composite data 152 using any statistical combination such as, but not limited to, averaging the correlated pixels 164. In this way various sources of stochastic noise such as LER or LWR may be mitigated or otherwise suppressed. The design-assisted composite data 152 may then be used as the basis for any number or type of metrology measurements of the line structure 154 of interest. For instance, the design-assisted composite data 152 illustrated in the inset 166 may be utilized for metrology measurements such as a position of the left edge 168, a position of the right edge 170, a width of the line structure 154 (e.g., a CD measurement), or lateral position along the direction of the linear trace.

As illustrated in FIG. 3, design-assisted composite data 152 may be generated without generating a conventional high-resolution image of any particular instance of a structure of interest (e.g., the line structure 154 in FIG. 3). Rather, the design-assisted composite data 152 can be built up by measurements of common features on many different instances of the structure of interest. Metrology based on design-assisted composite data 152 as disclosed herein can beneficially provide high sensitivity and high throughput while also limiting damage of the sample 108 during the measurement process. In particular, the lack of a requirement to generate an image of the structure of interest enables substantial flexibility for tailoring the scan pattern 158 for a particular application or sample design. For example, the scan pattern 158 may include one or more traces 160 of arbitrary length or curvature. By way of another example, the scan pattern 158 may include a sparse distribution of traces 160. Further, a scan pattern 158 may be designed to limit the exposure dose on the sample 108. For instance, the scan pattern 158 may be designed to limit to the exposure dose to a level below a damage threshold of the sample 108 or any structures thereon.

Figure 4:
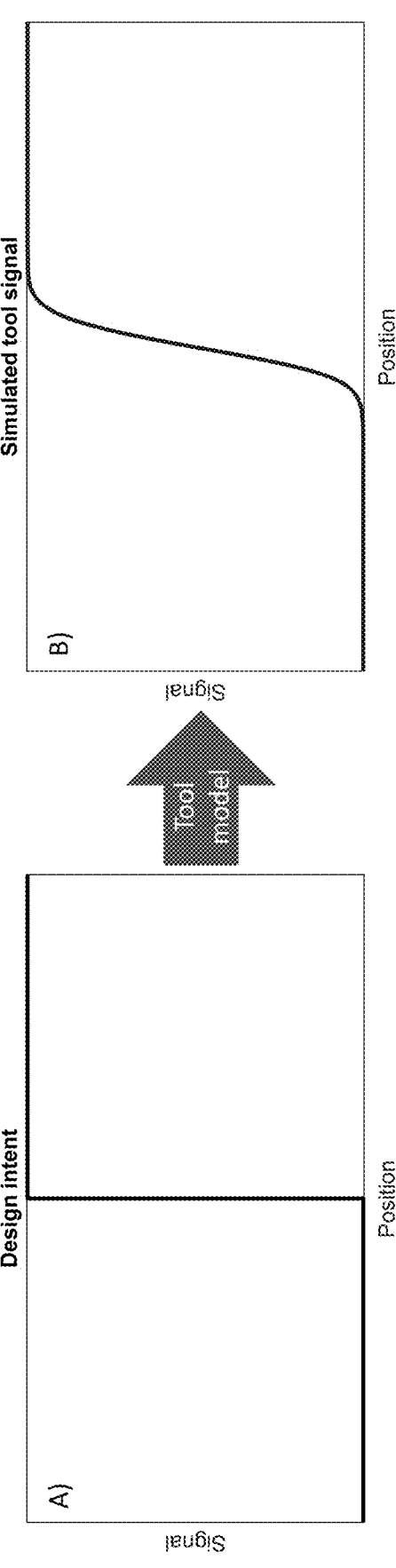
FIG. 4 is an exemplary simulated tool signal generated from design intent.

Turning back to FIG. 6, a simulated tool signal is determined from noise sources and imaging properties of the wafer metrology tool and the design of the wafer at 202. An example is shown in FIG. 4. A tool model can be applied to account for tool properties, such as imaging characteristics, beam characteristics (e.g., beam jitter), and/or tool noise (e.g., shot noise or stage jitter). The simulated tool signal is the expected result of the design intent after considering the tool properties. Thus, the simulated tool signal can be an ideal measurement given the associated, for example, stage jitter on a tool.

An example of determining a simulated tool signal is disclosed in Villarrubia et al., "3D Monte Carlo Modeling of the SEM: Are There Applications to Photomask Metrology" (2014), which is incorporated by reference in its entirety. An imaging model can be combined with a model of other error sources such as stage vibration. Thus, the combined model can use tool sensor signals (e.g., from a stage interferometer). A simulated tool signal can be created combining imaging noise from the imaging model and other tool noise from the tool model.

In an instance, the edges in the design file are infinitely sharp and binary. This can show the inside of structure versus the outside of a structure. The model to determine the simulated tool signal can include an amplitude and offset of a signal inside a structure and outside of a structure. The model to determine the simulated tool signal also can include beam properties for edge shape. These beam properties can be similar to a point-spread-function in optics.

Figure 5:
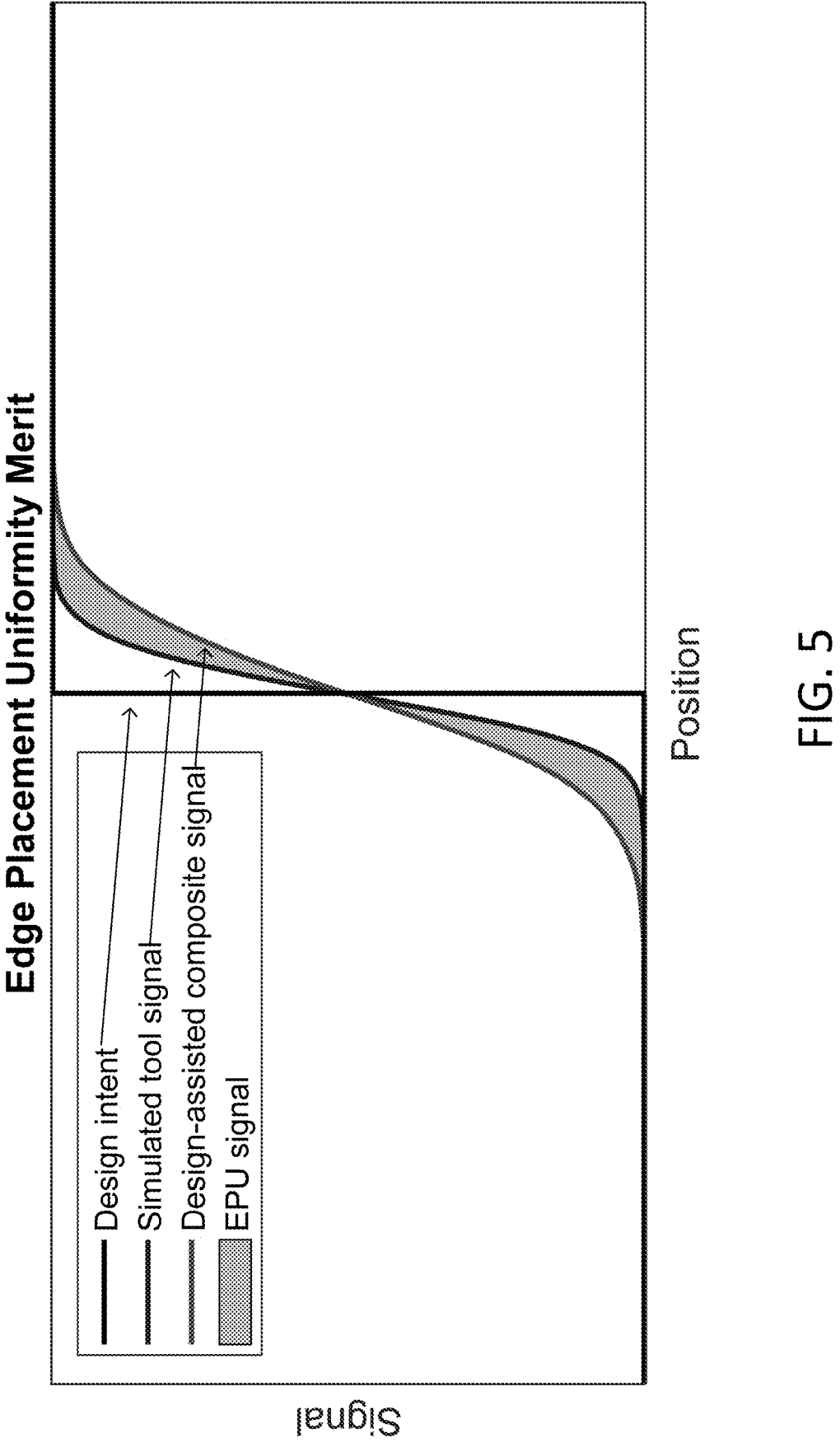
FIG. 5 is an edge placement uniformity signal as compared to the design-assisted composite signal and the simulated tool signal.

As shown in FIG. 6, an EPU signal is determined at 203. The EPU signal is a difference between the design-assisted composite signal and the simulated tool signal, which is shown in FIG. 5. For example, the EPU signal can be the overall area of the difference between the design-assisted composite signal and the simulated tool signal. The detailed shape and/or area of the EPU signal is primarily caused by the wafer stochastics. Thus, overall information like the distribution of edge placement errors can be determined from the EPU signal.

Disregarding additional variations (e.g., thickness, sidewall angle) and noise, then single edge signals should have the same shape with different shifts (e.g., edge placement). Edge placement errors tend to be caused by stochastic effects (e.g., LER, LWR, CD uniformity, or pattern placement variations). The shape of the resulting measured signal contains information about the amplitude and underlying distribution (e.g., Gaussian/normal, uniform). This can enable convolution of the random distribution and the single edge signal. The extraction of a single edge signal and distribution can be done using various approaches such as blind deconvolution.

Besides the area between design-assisted composite signal and the simulated tool signal, the EPU signal also can be determined based on local slope and/or gradient difference, local curvature differences, or local asymmetries. Any of these other measurements can be combined together with or without the area between design-assisted composite signal and the simulated tool signal to determine the EPU signal.

The EPU signal can be analyzed. The shape can be caused by at least stochastics. The EPU signal can be used to extract edge noise (e.g., LER, LWR, CD uniformity), edge shape variation (e.g., sidewall angle, sidewall angle variation), or signal strength variation (e.g., stack thickness variation). Analyzing the shape of the EPU signal can be used to determine placement or extent of stochastics. For example, average placement ($\mu$) can be determined by the relative shift between the simulated signal and the measured signal. If the simulated tool signal accounts for any tool errors, then the EPU signal is likely caused by issues with the wafer such as stochastics.

Analyzing the EPU signal can be used to evaluate what in the EPU signal is simulated and what is not. An EPU signal that is different from the simulated tool signal can indicate that a stochastic or other error is present. The difference in shape or area between the simulated tool signal and the EPU signal can indicate the type of stochastic. The shape can include slope, curvature, asymmetry, or other aspects of the borders of the EPU signal relative to that of the simulated tool signal.

In an embodiment, distribution of edge placement errors or other variation ($\sigma$) can be determined based on the shape. The wafer can be inspected at locations with the edge placement errors.

The EPU signal can be compared against a specification (i.e., a control limit) for the wafer. The specification may be a maximum area between the simulated tool signal and the design-assisted composite signal, a shape, a slope, a curvature, an asymmetry, or other targets. For example, areas where the EPU signal are inside the specification are accepted. Areas where the EPU signal are outside the specification are marked for additional review. In an instance, the additional review is uses a SEM or an optical tool to fully characterize wafer stochastics (e.g., CD or LER).

By accounting for tool characteristics in the simulated tool signal, the EPU signal can account for a remainder caused by the wafer. The simulated tool signal is configured to account for tool errors. Therefore, a remainder can be stochastics on the wafer.

In an example, design data for a wafer is received. This design data is used to determine the simulated tool signal. The simulated tool signal also can account for the various tool properties of the tool making the measurements. The design and measurements are used to determine the design-assisted composite signal. In an instance, the design-assisted composite signal is determined from measurements made during overlay metrology. The EPU signal is then determined by comparing the simulated tool signal and the design-assisted composite signal. An extraction algorithm can be applied to the EPU signal. This example can provide fast screening of structures with respect to wafer stochastics without the need to fully characterize all individual structures. A larger FOV can be used during this screening, which can affect the speed. If the same electron beam is used over a larger FOV, then each structure also is exposed to a lower dose because the electron dose is spread over a larger area. In an instance, only areas with stochastics that give a result outside of a specification need to be reviewed to detect problematic or faulty features.

Figure 7:
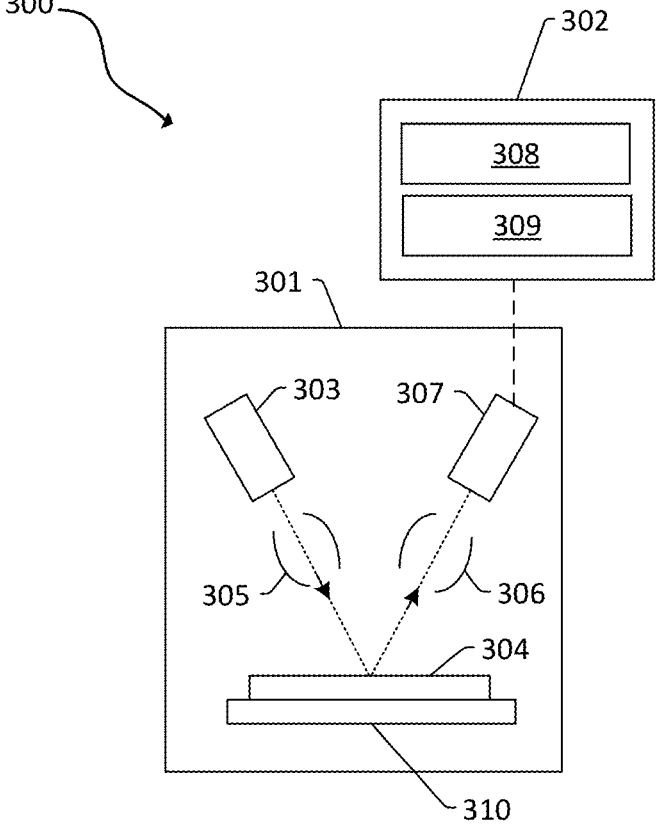
FIG. 7 is a block diagram of an exemplary system in accordance with the present disclosure.

FIG. 7 is a block diagram of an embodiment of a system 300. The system 300 includes a wafer metrology tool (which includes the electron column 301) configured to generate signals of a wafer 304. While the signal can be an image, other data is possible.

The wafer metrology tool includes an output acquisition subsystem that includes at least an energy source and a detector. The output acquisition subsystem may be an electron beam-based output acquisition subsystem. For example, in one embodiment, the energy directed to the wafer 304 includes electrons, and the energy detected from the wafer 304 includes electrons. In this manner, the energy source may be an electron beam source. In one such embodiment shown in FIG. 7, the output acquisition subsystem includes electron column 301, which is coupled to computer subsystem 302. A stage 310 may hold the wafer 304 or another type of sample.

As also shown in FIG. 7, the electron column 301 includes an electron beam source 303 configured to generate electrons that are focused to wafer 304 by one or more elements 305. The electron beam source 303 may include, for example, a cathode source or emitter tip. The one or more elements 305 may include, for example, a gun lens, an anode, a beam limiting aperture, a gate valve, a beam current selection aperture, an objective lens, and a scanning subsystem, all of which may include any such suitable elements known in the art.

Electrons returned from the wafer 304 (e.g., secondary electrons) may be focused by one or more elements 306 to detector 307. One or more elements 306 may include, for example, a scanning subsystem, which may be the same scanning subsystem included in element(s) 305.

The electron column 301 also may include any other suitable elements known in the art.

Although the electron column 301 is shown in FIG. 7 as being configured such that the electrons are directed to the wafer 304 at an oblique angle of incidence and are scattered from the wafer 304 at another oblique angle, the electron beam may be directed to and scattered from the wafer 304 at any suitable angles. In addition, the electron beam-based output acquisition subsystem may be configured to use multiple modes to generate signals of the wafer 304 (e.g., with different illumination angles, collection angles, etc.). The multiple modes of the electron beam-based output acquisition subsystem may be different in any signal generation parameters of the output acquisition subsystem.

Computer subsystem 302 may be coupled to detector 307 as described above. The detector 307 may detect electrons returned from the surface of the wafer 304 thereby forming signals related to the wafer 304. The signals may include any suitable electron beam images or other data. Computer subsystem 302 may be configured to perform any of the functions described herein using the output of the detector 307 and/or the signals. Computer subsystem 302 may be configured to perform any additional step(s) described herein. A system 300 that includes the output acquisition subsystem shown in FIG. 7 may be further configured as described herein.

It is noted that FIG. 7 is provided herein to generally illustrate a configuration of an electron beam-based output acquisition subsystem that may be used in the embodiments described herein. The electron beam-based output acquisition subsystem configuration described herein may be altered to optimize the performance of the output acquisition subsystem as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

Although the output acquisition subsystem is described above as being an electron beam-based output acquisition subsystem, the output acquisition subsystem may be an ion beam-based or neutral-beam based output acquisition subsystem. Such an output acquisition subsystem may be configured as shown in FIG. 7 except that the electron beam source may be replaced with any suitable beam source known in the art. In addition, the output acquisition subsystem may be any other suitable beam-based output acquisition subsystem such as those included in commercially available focused ion beam (FIB) systems, helium ion microscopy (HIM) systems, and secondary ion mass spectroscopy (SIMS) systems. While illustrated with an electron beam, other output acquisition subsystems or different systems, such as scanning near-field optical microscopy (SNON), near-field scanning optical microscopy (NSOM), a scanning probe, atomic force microscopy (AFM), or other optical scanning that uses photons (e.g., TDI, photodiodes), can be used.

The computer subsystem 302 includes a processor 308 and an electronic data storage unit 309. The processor 308 may include a microprocessor, a microcontroller, or other devices.

The computer subsystem 302 may be coupled to the components of the system 300 in any suitable manner (e.g., via one or more transmission media, which may include wired and/or wireless transmission media) such that the processor 308 can receive output. The processor 308 may be configured to perform a number of functions using the output. The wafer metrology tool can receive instructions or other information from the processor 308. The processor 308 and/or the electronic data storage unit 309 optionally may be in electronic communication with another wafer metrology tool, a wafer inspection tool, or a wafer review tool (not illustrated) to receive additional information or send instructions.

The processor 308 is in electronic communication with the wafer metrology tool, such as the detector 307. The processor 308 may be configured to process signals generated using measurements from the detector 307. For example, the processor may perform embodiments of the method 200.

The computer subsystem 302, other system(s), or other subsystem(s) described herein may be part of various systems, including a personal computer system, image computer, mainframe computer system, workstation, network appliance, internet appliance, or other device. The subsystem(s) or system(s) may also include any suitable processor 308 known in the art, such as a parallel processor. In addition, the subsystem(s) or system(s) may include a platform with high-speed processing and software, either as a standalone or a networked tool.

The processor 308 and electronic data storage unit 309 may be disposed in or otherwise part of the system 300 or another device. In an example, the processor 308 and electronic data storage unit 309 may be part of a standalone control unit or in a centralized quality control unit. Multiple processors 308 or electronic data storage units 309 may be used.

The processor 308 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 308 to implement various methods and functions may be stored in readable storage media, such as a memory in the electronic data storage unit 309 or other memory.

If the system 300 includes more than one computer subsystem 302, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems also may be effectively coupled by a shared computer-readable storage medium (not shown).

The processor 308 may be configured to perform a number of functions using the output of the system 300 or other output. For instance, the processor 308 may be configured to send the output to an electronic data storage unit 309 or another storage medium. The processor 308 may be further configured as described herein.

The processor 308 or computer subsystem 302 also can be part of a defect review system, an inspection system, a metrology system, or some other type of system. Thus, the embodiments disclosed herein describe some configurations that can be tailored in a number of manners for systems having different capabilities that are more or less suitable for different applications.

The processor 308 may be configured according to any of the embodiments described herein. The processor 308 also may be configured to perform other functions or additional steps using the output of the system 300 or using data from other sources.

The processor 308 may be communicatively coupled to any of the various components or sub-systems of system 300 in any manner known in the art. Moreover, the processor 308 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the processor 308 and other subsystems of the system 300 or systems external to system 300.

For instance, the various steps described throughout the present disclosure may be carried out by a single processor 308 (or computer subsystem 302) or, alternatively, multiple processors 308 (or multiple computer subsystems 302). Moreover, different sub-systems of the system 300 may include one or more computing or logic systems. Therefore, the above description should not be interpreted as a limitation on the present disclosure but merely an illustration.

An additional embodiment relates to a non-transitory computer-readable medium storing program instructions executable on a processor for performing a computer-implemented method for determining an EPU signal, as disclosed herein. In particular, as shown in FIG. 7, electronic data storage unit 309 or other storage medium may contain non-transitory computer-readable medium that includes program instructions executable on the processor 308. The computer-implemented method may include any step(s) of any method(s) described herein.

Program instructions implementing methods such as those described herein may be stored on computer-readable medium, such as in the electronic data storage unit 309 or other storage medium. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), Streaming SIMD Extension (SSE), or other technologies or methodologies, as desired.

Each of the steps of the method may be performed as described herein. The methods also may include any other step(s) that can be performed by the processor and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method comprising:

determining, using a processor, a design-assisted composite signal from a plurality of features on a wafer using measurements of the wafer from a wafer metrology tool and a design of the wafer, wherein the design-assisted composite signal is a combination of the measurements;

determining, using the processor, a simulated tool signal for the design of the wafer that accounts for noise sources and imaging properties of the wafer metrology tool;

determining, using the processor, an edge placement uniformity signal that is a difference between the design-assisted composite signal and the simulated tool signal; and analyzing a shape and/or an area of the edge placement uniformity signal thereby determining placement of stochastics, wherein the shape and the area are caused by at least the stochastics.

2. The method of claim 1, wherein the wafer metrology tool is a scanning electron microscope.

3. The method of claim 1, wherein the measurements of the wafer are generated during overlay measurements of the wafer.

4. The method of claim 1, further comprising determining a distribution of edge placement errors based on the shape.

5. The method of claim 4, further comprising inspecting the wafer at locations with the edge placement errors.

6. The method of claim 1, wherein the measurements are of a plurality of lines of devices on the wafer.

7. The method of claim 6, wherein each of the plurality of lines has one of the edge placement uniformity signals.

8. The method of claim 1, further comprising comparing, using the processor, the edge placement uniformity signal against a specification for the wafer.

9. The method of claim 1, wherein the design-assisted composite signal is an average of the measurements.

10. The method of claim 1, wherein the feature is an edge of a structure on the wafer.

11. The method of claim 1, wherein the feature is a center of a structure on the wafer.

12. A non-transitory computer readable medium storing a program configured to instruct the processor to execute the method of claim 1.

13. A system comprising:

a particle beam source that generates a particle beam;

a stage configured to hold a wafer in a path of the particle beam;

a detector that receives particles from the wafer; and a processor in electronic communication with the detector, wherein the processor is configured to:

determine a design-assisted composite signal from a plurality of features on the wafer using measurements of the wafer and a design of the wafer, wherein the design-assisted composite signal is a combination of the measurements;

determine a simulated tool signal for the design of the wafer that accounts for noise sources and imaging properties of the wafer metrology tool;

determine an edge placement uniformity signal that is a difference between the design-assisted composite signal and the simulated tool signal; and analyze a shape and/or an area of the edge placement uniformity signal thereby determining placement of stochastics, wherein the shape and the area are caused by at least the stochastics.

14. The system of claim 13, wherein the system is a scanning electron microscope.

15. The system of claim 13, wherein the processor is further configured to determine distribution of edge placement errors based on the shape.

16. The system of claim 15, wherein the processor is further configured to send instructions to inspect the wafer at locations with the edge placement errors using the particle beam.

17. The system of claim 13, wherein the processor is further configured to compare the edge placement uniformity signal against a specification for the wafer.

18. The system of claim 13, wherein the particle beam is an electron beam, a photon beam, an ion beam, or a neutral particle beam.

* * * * *